United States Patent [19]

Saito et al.

[11] Patent Number: 4,467,452

[45] Date of Patent: Aug. 21, 1984

[54] NONVOLATILE SEMICONDUCTOR MEMORY DEVICE AND METHOD OF FABRICATING THE SAME

[75] Inventors: Shozo Saito; Yukimasa Uchida, both of Yokohama; Kazuhiko Hashimoto, Tokyo; Norio Endo, Yokohama, all of Japan

[73] Assignee: Tokyo Shibaura Denki Kabushiki Kaisha, Japan

[21] Appl. No.: 331,066

[22] Filed: Dec. 15, 1981

[30] Foreign Application Priority Data

Feb. 12, 1981 [JP] Japan .................................. 56-19498
Feb. 12, 1981 [JP] Japan .................................. 56-19499

[51] Int. Cl.³ ...................... G11C 11/40; H01L 29/78
[52] U.S. Cl. ........................................ 365/184; 357/23
[58] Field of Search ............... 365/174, 182, 184, 185; 357/23 VT

[56] References Cited

U.S. PATENT DOCUMENTS 4,101,921  7/1978  Shimada et al. ............... 357/23 VT
4,151,538  4/1979  Polinsky et al. ............... 357/23 VT
4,198,252  4/1980  Hsu ........................................ 148/187
4,353,083  10/1982  Trudel et al. .................. 357/23 VT

FOREIGN PATENT DOCUMENTS 52-105784  3/1976  Japan .
55-36995   8/1979  Japan .

Primary Examiner—Joseph A. Popek
Attorney, Agent, or Firm—Finnegan, Henderson, Farabow, Garrett & Dunner

[57] ABSTRACT

A nonvolatile semiconductor memory device having a gate insulating film with a memory function. An impurity layer having the same conductivity type as that of the substrate region is formed in that substrate region, underlying the gate insulating film having a memory function, in which a channel is formed. The impurity layer has an impurity profile in which a peak of an impurity concentration is in the region distanced by 500 Å or less from the surface of the substrate region and the impurity concentration is $1 \times 10^{18} \, \mathrm{cm}^{-3}$ or less in the region at the depth of 500 Å or more.

5 Claims, 23 Drawing Figures

FIG. 3
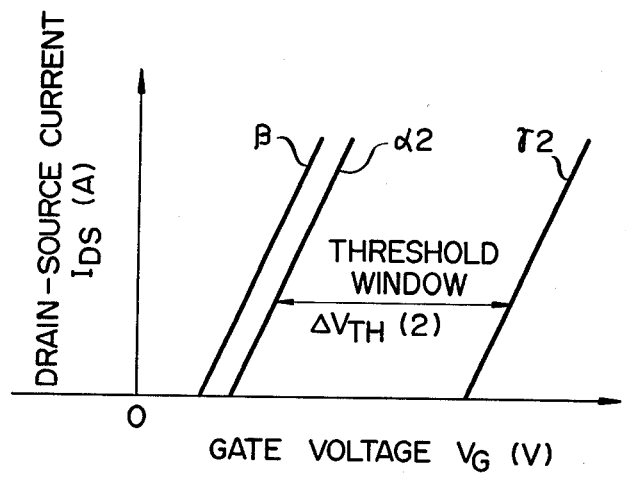
FIG. 4A   FIG. 4B   FIG. 4C
ERASE      WRITE     WRITE-INHIBIT
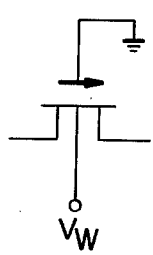 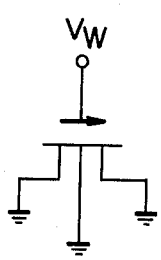 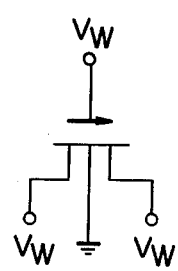

NONVOLATILE SEMICONDUCTOR MEMORY DEVICE AND METHOD OF FABRICATING THE SAME

BACKGROUND OF THE INVENTION

The present invention relates to a nonvolatile semiconductor memory device having a gate insulating layer with a memory function.

An electrically alterable read only memory (EAROM) using field effect transistors with double gate insulation layer has recently received considerable attention because of its useful features that it is nonvolatile and it is electrically alterable. A metal nitride oxide semiconductor (MNOS) has been well known as the memory device of this type.

The MNOS device is generally constructed as shown in FIG. 1. An N+ source region 22 and an N+ drain region 24, separated from each other, are formed on a P type semiconductor substrate 20. A silicon oxide layer 26 of 500 to 1500 Å in thickness, provided on p-n junctions of the source region 22 and the semiconductor substrate 20, and the drain region 24 and the semiconductor substrate 20, serves as a source/drain protecting portion. An extremely thin silicon oxide layer 30 of 15 to 30 Å in thickness is formed on the central portion of the substrate region 28 sandwiched between the source region 22 and the drain region 24, in which a channel is formed. A silicon nitride layer 32 of 400 to 600 Å in thickness and with a memory function, layered on the silicon oxide layer 30, serves as a memory portion. Further formed on the silicon nitride layer 32 is a gate electrode 34 made of aluminum, for example. The source region 22 and the drain region 24 are respectively in ohmic contact with a source electrode 36 and a drain electrode 38, those electrodes being made of aluminum.

The n-channel MNOS device thus constructed generally has a characteristic of a drain-source current $I_{DS}$ vs. a gate voltage $V_G$, as shown in FIG. 2. In the graph, a curve $\alpha 1$ indicates a characteristic of the central portion of substrate region 28 after data in the silicon nitride layer 32 is erased; a curve $\beta$ a characteristic of the source/drain protecting portion of the MNOS device formed of a thick silicon oxide layer 26; a curve $\gamma 1$ a characteristic of the central portion of substrate region 28 after data is written into the silicon nitride layer 32. A threshold voltage after data is erased is negative. The source/drain protecting portion is of the enhancement type in order to obtain a selective characteristic of the memory cell, so that the threshold voltage of the source/drain protecting part is lower than the threshold voltage after the data write and larger than the threshold voltage after the data erasure, that is, + several volts. Therefore, a threshold voltage difference $\Delta V_{TH}(1)$ (referred to as a threshold window) effectively usable is considerably narrow. An LSI memory constructed by using the MNOS device with above-mentioned threshold window has a drawback that a data retention time is short. Because the threshold voltage after the data write and after the data erasure gradually damps with time, the threshold window $\Delta V_{TH}(1)$ becomes small with time. In other words the narrow threshold voltage makes the data retention time short.

In order to make the data retention time long, it is desirable to set the threshold window $\Delta V_{TH}(1)$ at the initial stage as long as possible. To realize this, the curve $\alpha 1$ of FIG. 2 representing the $I_{DS}-V_G$ characteristic after the data erasure and the curve $\gamma 1$ of FIG. 2 representing the $I_{DS}-V_G$ characteristic after the data write are translated by 3 to 4 V in the positive direction to curves $\alpha 2$ and $\gamma 2$ of FIG. 3. In this case, the threshold window $\Delta V_{TH}(2)$ is defined by a difference between the curves $\alpha 2$ and $\gamma 2$. A method to obtain the threshold window $\Delta V_{TH}(2)$ is disclosed in Japanese Patent (KOKAI) Nos. 105784/77 and 36995/80 and U.S. Pat. No. 4,198,252. In the Japanese Patent (KOKAI) No. 105784/77, ions are implanted into the surface region of a semiconductor substrate in the memory part to form an impurity layer with a higher impurity concentration than that of its vicinal region. This method is substantially equal to the method used to control the threshold voltage of the MOS transistor. To be more specific, boron, for example, is implanted into the semiconductor substrate through a thick silicon oxide film at a relatively high acceleration voltage 50 to 60 KV. After removing the thick silicon oxide film, a very thin silicon oxide film is provided on the surface of semiconductor substrate from which the silicon oxide film is removed. Further formed on the silicon oxide film is a silicon nitride film. Finally, a conductive layer made of aluminum is formed on the silicon nitride film, thereby completing an MNOS transistor.

In the U.S. Pat. No. 4,198,252 and the Japanese Patent (KOKAI) No. 36995/80, there is disclosed a method for preventing a lateral diffusion of the impurity layer.

The selection principle of memory cells in the EAROM will be described referring to FIG. 4. A general memory cell is constructed of a single MNOS transistor. In this case, to erase the data stored, a gate electrode of an MNOS transistor is grounded as shown in FIG. 4A and a writing voltage $V_W$ is applied to the semiconductor substrate. As a result, the threshold voltage becomes a low level "0". In order to write data into the memory, the semiconductor substrate, the source electrode and the drain electrode are grounded and the writing voltage $V_W$ is applied to the gate electrode, as shown in FIG. 4B. As a result, the threshold voltage is a high level "1". For inhibiting the data write, that is, write a low level "0", the writing voltage $V_W$ is applied to the gate electrode, the source and drain electrodes. The result is that the threshold voltage is a low level "0".

The inventors of the present patent application have succeeded in translating the threshold voltages by 3 to 4 V in the memory portion in the MNOS transistor by a conventional method to implant ions through a thick oxide film of about 1000 Å under a condition that an acceleration voltage is 60 KV and a dosage of boron is $2 \times 10^{13} \text{cm}^{-2}$. In a write inhibiting mode, however, the threshold voltage to be left at a low level "0" erroneously shifts toward the write level "1". Frequently, the threshold voltage after the write inhibiting mode is larger than that after the write mode.

In FIG. 5, curves $\delta 1$, $\delta 2$ and $\delta 3$ indicate respectively variations of threshold voltages $V_{TH}$ of the MNOS transistor manufactured by the above-mentioned method after the erasing operation, the write operation and the write inhibiting operation with respect to a write/erasure voltage. In this case, the pulse width of each of the write, erasure and write inhibiting voltages is 10 ms, the erasure voltage is $-30$ V and ambient temperature is 25° C. The threshold voltage is defined as a voltage obtained by the extrapolation such that the drain voltage be 5.0 V and the drain-source current be 0 μA. As seen from the figure, the threshold voltage of the MNOS transistor after the write inhibiting mode is higher than that after the write mode.

Our study on this phenomena found a cause for the erroneous operation. Generally, in the MNOS structure, a dielectric constant of the silicon nitride film is high and the gate insulating film is thin. In order to translate the threshold voltage by 3 to 4 V, a peak value of the surface impurity concentration of an impurity layer provided in the substrate region in which a channel is formed must be set to about $1 \times 10^{18}$ cm$^{-3}$. In order to obtain the impurity concentration, boron ion are implanted into the substrate region through silicon oxide film with the same thickness as that of the source/drain protecting part under a condition that the acceleration voltage is 60 KV and the impurity concentration is about $1 \times 10^{13}$ cm$^{-2}$. As the result of the boron ions implant, a profile of the impurity concentration as shown in FIG. 6 is obtained in which a peak impurity concentration is at the depth of 1000 Å or more from the surface of the semiconductor substrate. After the ion implantation, the semiproduct of the device is generally subjected to one or two heat treatments. In this case, an impurity profile obtained is a further expansion of the profile as indicated by a curve $\zeta$ in FIG. 6. Therefore, in order to obtain the peak value of the surface impurity concentration in the impurity layer of $1 \times 10^{18}$ cm$^{-3}$, a greater number of boron ions must be implanted. As a result, a high electric field is developed in the Si-SiO$_2$ interface by the boron ions implanted at a high concentration. The collision ionization in the high electric field causes pairs of electron and hole. Electrons generated are known as substrate hot electrons. A potential barrier of an extremely thin silicon oxide film is sufficiently low for the transmission of the hot electrons therethrough. Therefore, in the write inhibiting mode electrons are transmitted into the trap existing in the gate insulating film made of silicon nitride more easily and deeper than in the write mode. A great number of boron ions implanted into a deeper substrate provides a cause of the erroneous operation in the write inhibiting mode rather than translates the threshold voltage of the MNOS transistor.

SUMMARY OF THE INVENTION

Accordingly, a first object of the present invention is provide a nonvolatile semiconductor memory device with an excellent storage retention time and with no erroneous operation in the write inhibiting mode.

A second object of the present invention is to provide a method of fabricating the nonvolatile semiconductor memory device.

To achieve the above objects, an impurity layer of a first conductivity type is formed in a substrate region of the first conductivity type under a gate insulating film with a memory function where a channel is formed. The impurity layer has an impurity profile to inhibit electrons from being injected into the gate insulating film in the write inhibiting mode.

The impurity layer has an impurity profile in which a peak of the impurity concentration resides in the region at the depth of 500 Å or less from the surface of the substrate region and the impurity concentration is $1 \times 10^{18}$ cm$^{-3}$ or less at the depth of 500 Å or more.

In order to obtain the impurity profile, low energy ions of the same conductivity type as that of the semiconductor region are implanted in the substrate region, through a gate insulating layer with a memory function. Alternatively, a buffer layer with a proper ion stopping power is formed on a gate insulating film with a memory function and high energy ions are implanted into the substrate region, through the buffer layer and the gate insulating layer. An impurity profile obtained through the process has a peak of the impurity concentration in the substrate region at the depth 500 Å or less from the surface of the substrate region and the impurity concentration of $1 \times 10^{18}$ cm$^{-3}$ in the depth of 500 Å or more. As the continuous process as mentioned above has no step of high temperature heat treatment after the ion implantation, an impurity profile in the ion implantation can be maintained. Therefore, the erroneous operation in the write inhibiting mode can be prevented.

BRIEF DESCRIPTION OF THE DRAWINGS

Other objects and advantages of the invention will become apparent from the following detailed description when taken in connection with the accompanying drawings, in which:

FIG. 3 is a graph of an $I_{DS}-V_G$ characteristic when the $I_{DS}-V_G$ characteristic of the MNOS transistor after the data write and the data erasure shown in FIG. 2 is translated;

FIGS. 4A to 4C are circuit diagrams to explain the write, erasure and write-inhibiting modes of the MNOS memory cell;

DETAILED DESCRIPTION OF THE PREFERRED EMBODIMENTS

Figure 7A:
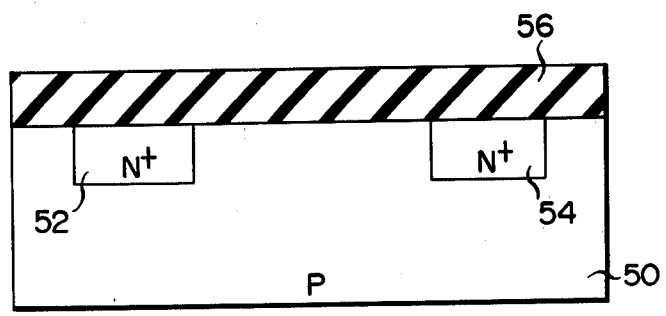
FIGS. 7A to 7F show cross sectional views showing a sequence of steps of fabricating process of an MNOS transistor according to the present invention.

An embodiment of a non-volatile semiconductor memory device according to the present invention will be described referring to FIGS. 7A to 7F. As shown in FIG. 7A, N type impurity is selectively diffused into a semiconductor substrate 50 made of silicon containing P type impurity of about $1 \times 10^{15}$ cm$^{-3}$, for example, thereby separately forming an N+ type source region 52 and an N+ type drain region 54. A silicon oxide film 56 of about 1 μm in thickness is formed on the surface of the substrate with the source and drain regions.

Figure 7B:
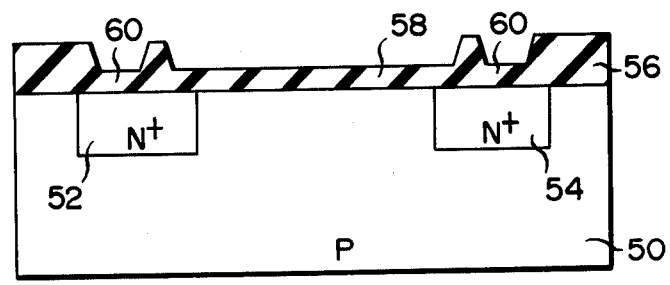

The silicon oxide film at a gate portion and a contact portion of the MNOS transistor is selectively etched away to expose the semiconductor substrate surface at their portions. As shown in FIG. 7B the semiconductor substrate surfaces exposed are thermally oxidized to form a thick silicon oxide film 58 with a thickness of about 1000 Å serving as a gate oxide film of the source-/drain protecting portion, and a silicon oxide film 60 at the contact portion.

Then, the thick silicon oxide film at the central portion of the substrate region 62 separated several μm from the source region 52 and the drain region 54 of the MNOS transistor, is removed. After this, the exposed surface of the semiconductor substrate is thermally oxidized to form an extremely thin silicon oxide film 64 of 15 to 30 Å in thickness, as shown in FIG. 7C.

Figure 7C:
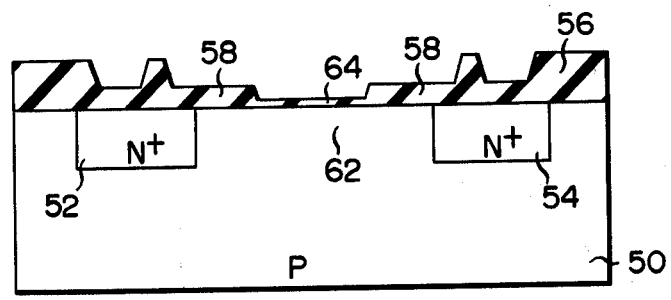
Figure 7D:
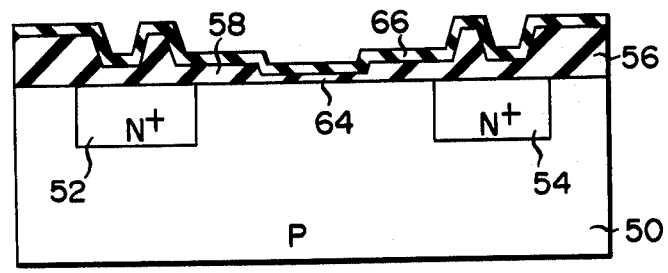

As shown in FIG. 7D, a gate insulating film 66 with a memory function and a 400 to 600 Å thickness, made of a silicon nitride film, is formed over the entire surface of the semiproduct in FIG. 7C. In this step, a heat treatment is performed for the purpose of the improvements of the surface mobility and the storage retention characteristics of the MNOS transistor.

Figure 6:
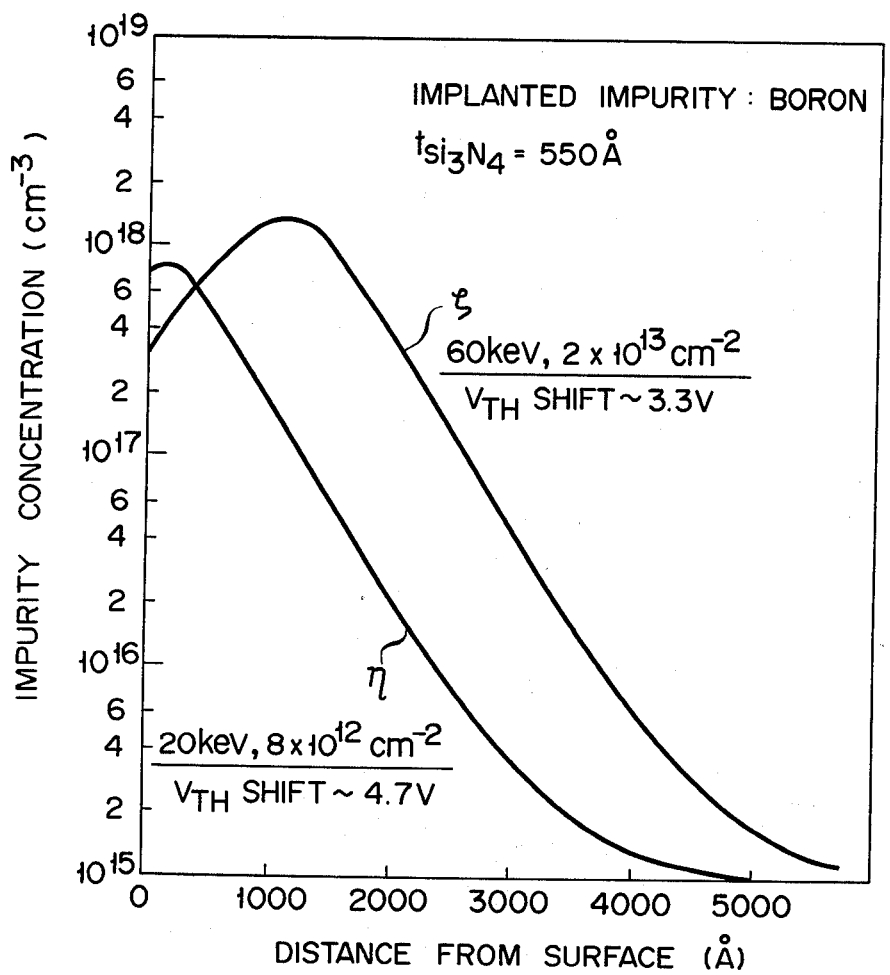
FIG. 6 shows a graph of impurity profiles when ions are implanted in a memory portion according to the conventional method and the method of present invention.
Figure 7E:
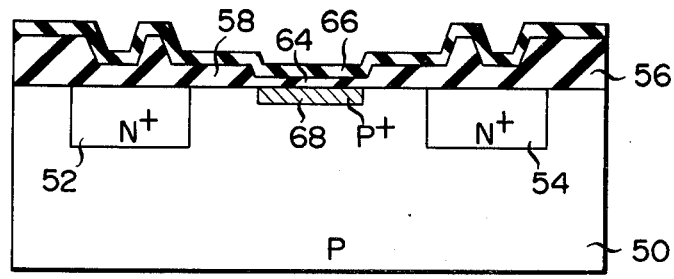

As shown in FIG. 7E, P type impurity of boron, for example, are directly ion-implanted, not by using the photoresist as a mask, into the central portion of the substrate region in which a channel is formed under a condition that an acceleration voltage is about 20 KV and the dosage is about $1 \times 10^{13}$ cm$^{-2}$. The thick silicon oxide film 58 and the gate insulating film 66 serve as the mask for the substrate region (source/drain protecting portion) on which the thick silicon oxide film 58 and the gate insulating film 66 are layered. Therefore, no impurity ions are implanted into the source/drain protecting portion. The ions are implanted into only the central portion of the substrate region on which an extremely thin silicon oxide film 64 and a gate insulating film 66 are layered, to form a P+ type impurity layer. An impurity profile as indicated by a curve η in FIG. 6 is obtained for the impurity layer 68 under the above-mentioned ion implanting condition. In the impurity profile, a peak of an impurity concentration resides in the region at the depth of 500 Å or less from the surface of the semiconductor substrate 50 and the impurity concentration in the depth of 500 Å or more is $10^{18}$ cm$^{-3}$ or less. After the ion implantation, the semiproduct is slightly subjected to the heat treatment. Therefore, the P type impurity implanted slightly diffuses laterally from the memory portion to the substrate region of the source-/drain protecting portion.

Figure 7F:
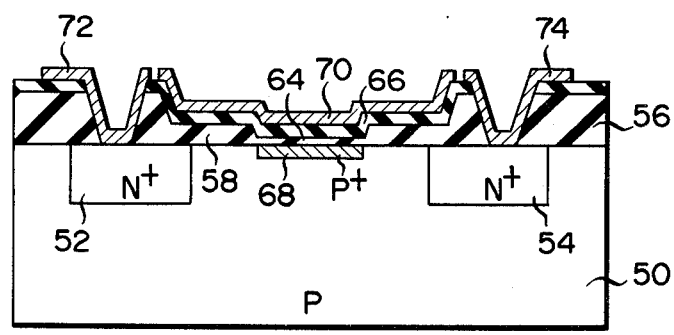

Then, as shown in FIG. 7F, after contacts for leading out electrodes are formed, aluminum, for example, is deposited and etched away to form a gate electrode 70, a source electrode 72 and a drain electrode 74, and finally to complete an MNOS transistor.

Figure 1:
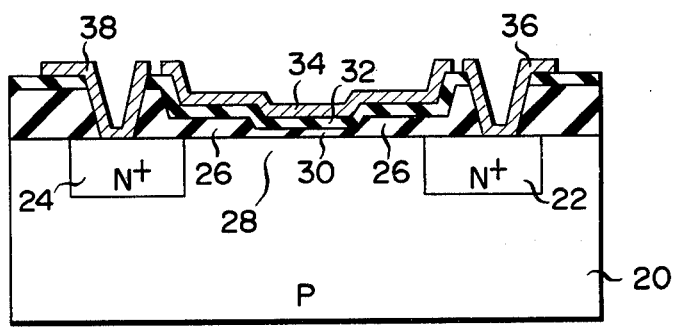
FIG. 1 shows a cross sectional view of a conventional N channel MNOS transistor.
Figure 2:
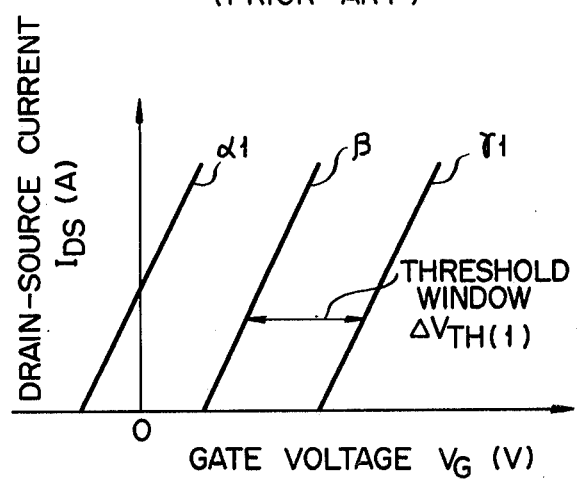
FIG. 2 is a graph of an $I_{DS}-V_G$ characteristic of the conventional MNOS transistor after the data write and the data erasure and an $I_{DS}-V_G$ characteristic of a source/drain protecting part of the conventional MNOS transistor.
Figure 5:
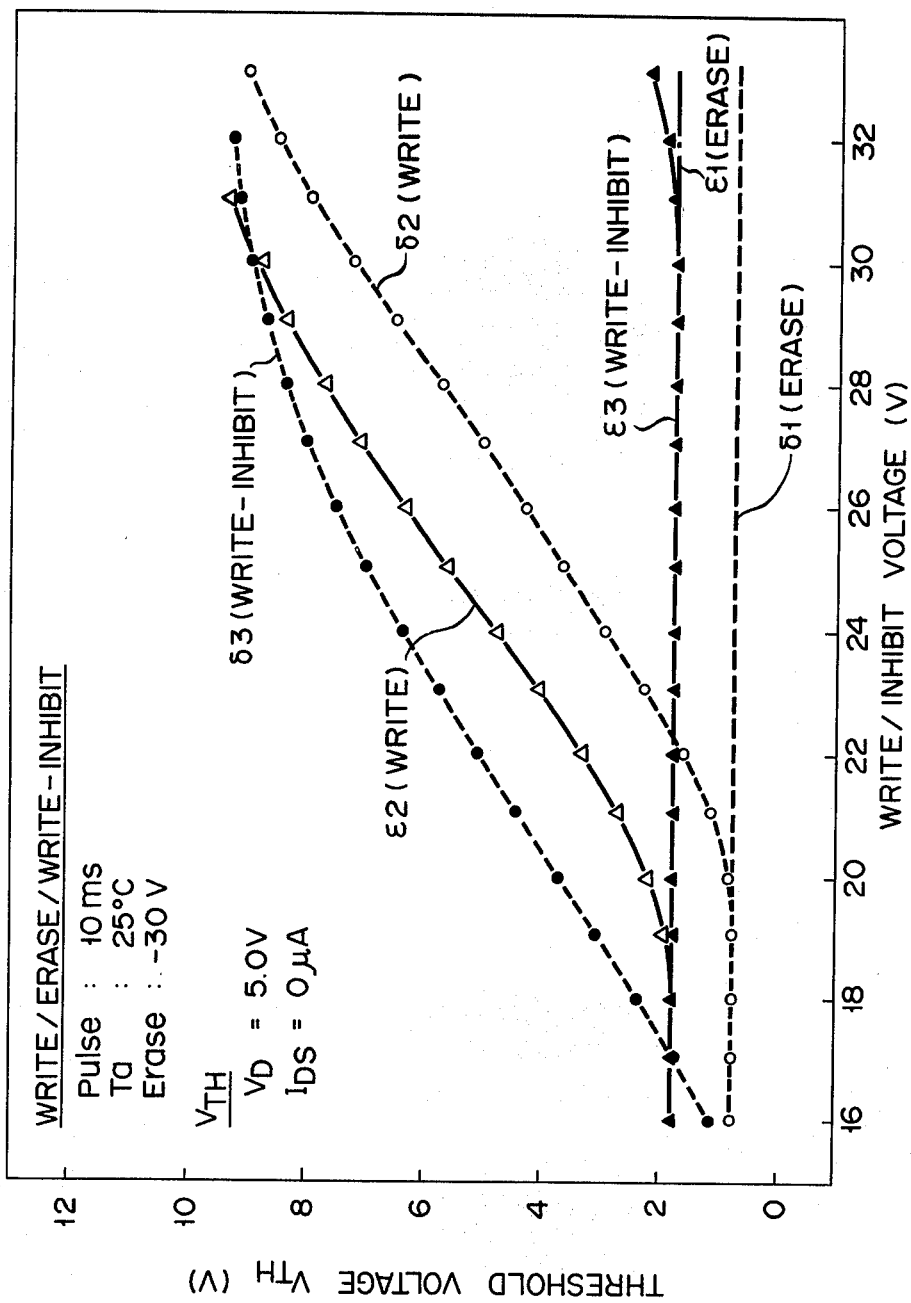
FIG. 5 shows relationships between a write/erasure voltage and a threshold voltage of n-channel MNOS transistors fabricated by a conventional fabricating method and a fabricating method of the present invention.

The n-channel MNOS transistor thus constructed has erasure, write, and write-inhibiting characteristics as indicated by curves $\epsilon_1$, $\epsilon_2$ and $\epsilon_3$ in FIG. 5, respectively. The threshold voltage as plotted by the curve $\epsilon_3$ of the MNOS transistor after the write-inhibiting operation has no change unlike the threshold voltage of the MNOS transistor manufactured by the prior art method. The reason for this is that since the total amount of impurity injected into the central part of the substrate region in which a channel is formed is small, and the above method has no heat treatment after the ion implantation, an electric field developed in the Si-SiO$_2$ interface is weakened. As a result, in the write inhibiting mode, the MNOS transistor is free from the erroneous write operation. A difference between threshold voltages in the write mode and in the erase mode with respect to the same write-inhibiting voltage, that is, the threshold window $\Delta V_{TH}$ of, the n-channel MNOS transistor according to the present invention is larger by about 1 V than that of the prior one. Accordingly, the threshold window $\Delta V_{TH}$ can further be expanded.

Figure 8:
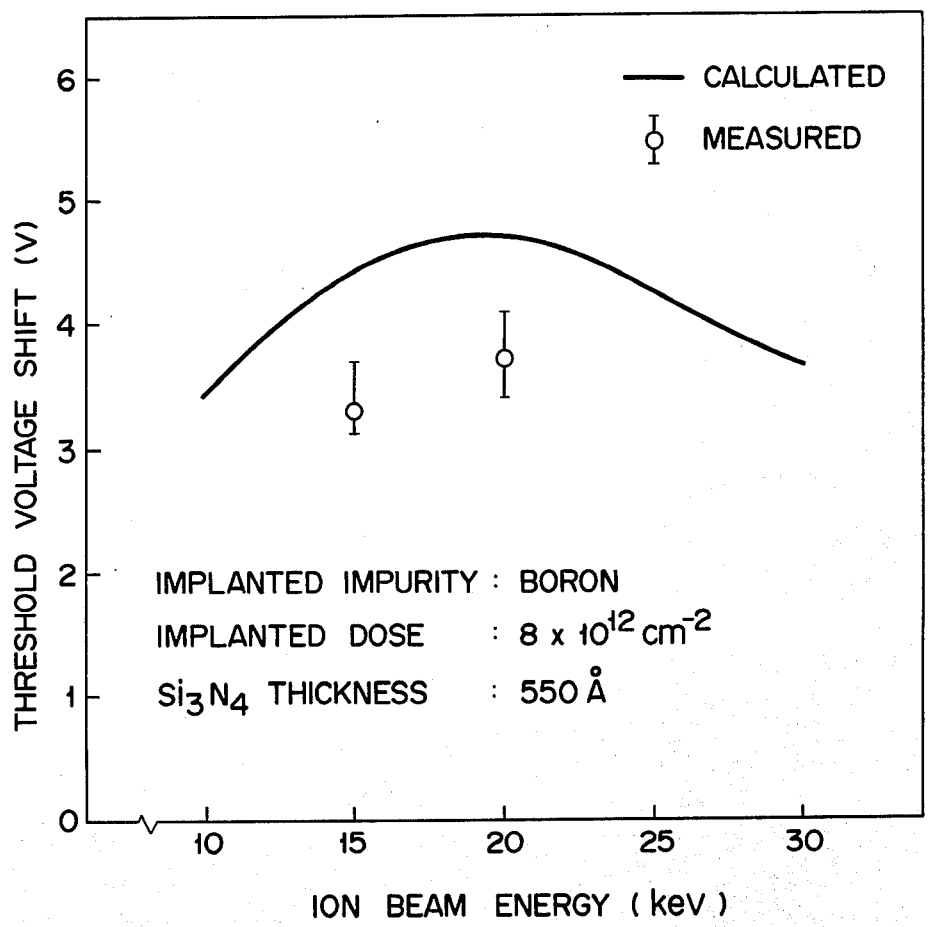
FIG. 8 shows a graph of a relationship of a threshold voltage shift vs. an ion beam energy.

FIG. 8 shows a variation of a threshold voltage shift with respect to a boron ion beam energy in the above-mentioned embodiment. A curve of the threshold voltage shift was plotted under a condition that the implanted dose was $8 \times 10^{12}$ cm$^{-2}$ and a silicon nitride layer as a buffer layer was 500 Å in thickness. In FIG. 8, calculated values and measured values are plotted. As seen from the graph, the threshold voltage shift exhibits a peak at a point of about 20 KeV of the ion beam energy. When the energy of about 30 KeV or less is used for the ion implantation of boron, an impurity region with a preferable structure may be formed.

As described above, by directly implanting ions through a gate insulating film 66 made of silicon nitride at the low acceleration voltage, the P type impurity layer 68 may be formed where a peak of the impurity concentration resides in the region at the depth of 500 Å or less from the surface of the semiconductor substrate in the memory portion and the impurity concentration is $1 \times 10^{18}$ cm$^{-3}$ or less in the region at the depth of 500 Å or more, without changing the surface impurity concentration on the source/drain protecting portion covered with the thick silicon oxide film 58 of about 1000 Å in thickness. In the above method, a few steps of the heat treatment follows the ion implantation, so that no rediffusion of the P type impurity into the semiconductor substrate is made, and hence a sharp profile of impurity may be formed.

As a result, even if threshold window $\Delta V_{TH}$ is translated in the positive direction while the threshold voltage in the source/drain protecting portion is fixed no erroneous writing operations is made in the write inhibiting mode, unlike the prior art MNOS transistor. Additionally, the threshold window $\Delta V_{TH}$ effectively used is expanded and the storage retention time may remarkably be improved. Moreover, a level of the threshold window $\Delta V_{TH}$ of the MNOS transistor is freely controllable, thus resulting in setting a read out voltage easily.

Figure 9:
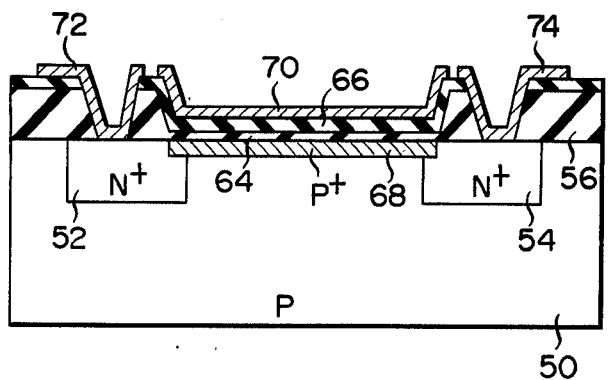
FIG. 9 shows a cross sectional view of another embodiment of an MNOS transistor according to the present invention.

Another embodiment of a nonvolatile semiconductor memory device according to the present invention will be described referring to FIG. 9. As shown, a gate insulating film 66 with a memory function, which is 400 to 600 Å in thickness and made of silicon nitride, is formed on a P type semiconductor substrate 50 in which an N+ type source region 52 and an N+ type drain region 54 are formed, with an extremely thin silicon oxide film 64 with a 15 to 30 Å thickness interposed therebetween. Unlike the above-mentioned embodiment, the thin silicon oxide film 64 is formed over the entire surface of the substrate region 50 between the source region 52 and the drain region 54. Thus, the thick silicon oxide film is not formed in the present embodiment. Further, a P+ type impurity layer 68 extending from the source region 52 to the drain region 54 is formed in the substrate region 50. The impurity layer 68 is formed by implanting boron ions into the substrate region through the silicon oxide film 64 and the gate insulating film 66 at a low acceleration voltage of 20 KV and with a dosage of the ions of $1 \times 10^{13}$ cm$^{-2}$, as in the previous embodiment. A gate electrode 70 of aluminum is formed on the gate insulating film 66 and a source electrode 72 made of aluminum and a drain electrode 74 made of aluminum are connected to the source and drain regions 52 and 54, respectively.

Since the MNOS transistor thus constructed has no source/drain protecting portion and therefore the threshold voltage is not limited, the threshold window $\Delta V_{TH}$ is wider than that of the first embodiment. An impurity distribution of the memory device in the present embodiment has a peak of about $1 \times 10^{18}$ cm$^{-3}$ in the region at the depth of 500 Å or less from the Si-SiO$_2$ interface which is formed between the silicon semiconductor substrate 50 and the thin silicon oxide film 64, and has an impurity concentration of $1 \times 10^{18}$ cm$^{-3}$ or less in the region at the depth of 500 Å or more. Therefore, no erroneous operation is performed in the write inhibiting operation mode.

Figure 10:
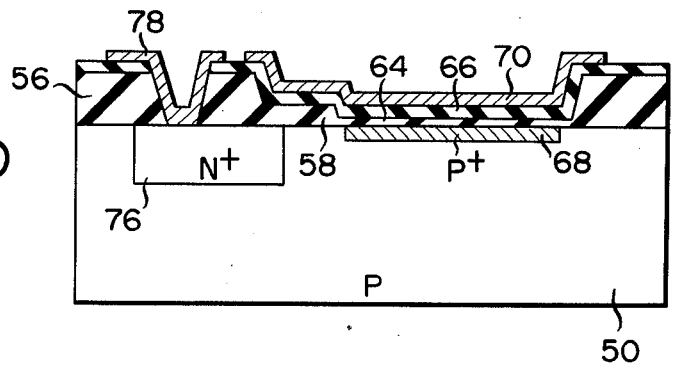
FIGS. 10 and 11 show cross sectional views of embodiments of MNOS capacitors according to the present invention.

Another embodiment of a nonvolatile semiconductor memory device according to the present invention will be described referring to FIG. 10. FIG. 10 shows an MNOS capacitor manufactured by the fabricating method according to the present invention. As shown, formed on the P type semiconductor substrate 50 with an N+ type impurity diffusion area 76 is a thick silicon oxide film 58 with a 1000 Å thickness in contact with the impurity diffusion area 76. An extremely thin silicon oxide film 64 with a 15 to 30 Å thickness is formed over the center portion of the substrate region 50 where a channel is formed therein. On the thick silicon oxide film 58 and the extremely thin silicon oxide film 64, a gate insulating film 66 with a memory function is formed which is made of silicon nitride and 400 to 600 Å in thickness. A gate electrode 70 is formed on the gate insulating film 66 and an aluminum electrode 78 is connected to an impurity diffusion region 76 through a hole formed in the silicon oxide film 56. In the substrate region under the extremely thin silicon oxide film 64, a P+ type impurity layer 68. For the formation of the impurity layer 68, boron ions, for example, are implanted into the substrate region 50 through an extremely thin silicon oxide film 64 and a gate insulating film 66 of Si$_3$N$_4$ at a low acceleration voltage of 20 KV and with a dosage of the boron ions of $1 \times 10^{13}$ cm$-2$, as in the previous embodiment. Of course, the MNOS capacitor is free from the erroneous write operation, like the MNOS transistor. The MONS capacitor in the present embodiment is used for the nonvolatile memory element disclosed in Japanese Patent (KOKAI) No. 72429/78, for example.

Figure 11:
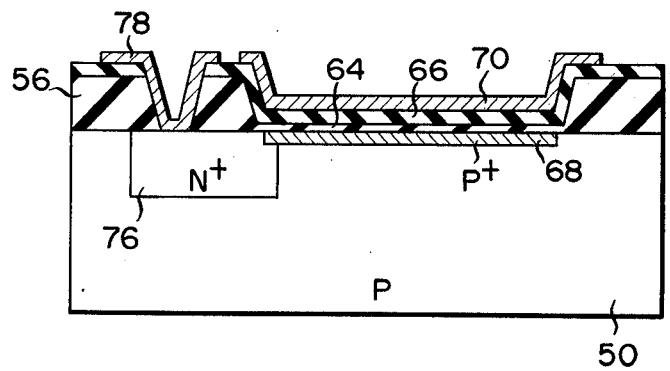

Yet another embodiment of a nonvolatile semiconductor memory device according to the present invention will be described referring to FIG. 11. FIG. 11 show another MNOS capacitor fabricated by the fabricating method according to the present invention. A gate insulating film 66 with a memory function, which is made of silicon nitride and 400 to 600 Å in thickness, is formed on the P type semiconductor substrate 50 with an N+ type impurity diffusion area 76, with an extremely thin silicon oxide film 64 with a 15 to 30 Å thickness interposed therebetween. The thin silicon oxide film 64 is formed over the entire surface of the substrate region in which a channel is formed. A gate electrode 70 is formed on the gate insulating film 66 and an aluminum electrode 78 is connected to an impurity diffusion region 76 through an opening formed in the silicon oxide film 56. An impurity layer 68 of the P+ type is formed in the substrate region under the extremely thin silicon oxide film 64. Since boron ions, for example, are implanted into the substrate region by using the gate insulating film 66 of silicon nitride (Si$_3$N$_4$) and the thin silicon oxide film 64 as a buffer layer, the impurity layer 68 is formed over the entire surface of the substrate region in which a channel is formed. The boron implanting condition is the same as that in the previous case. The MNOS capacitor has also no erroneous write operation.

Another fabricating method of a nonvolatile semiconductor memory device according to the present invention will be described referring to FIGS. 12A to 12F. By this fabricating method can also be formed an impurity layer with an impurity profile that a peak of the impurity concentration resides in the region at the depth of 500 Å or less from the surface of the semiconductor substrate and the impurity concentration in the region of 500 Å or more is $10^{18}$ cm$^{-3}$ or less.

Figure 12A:
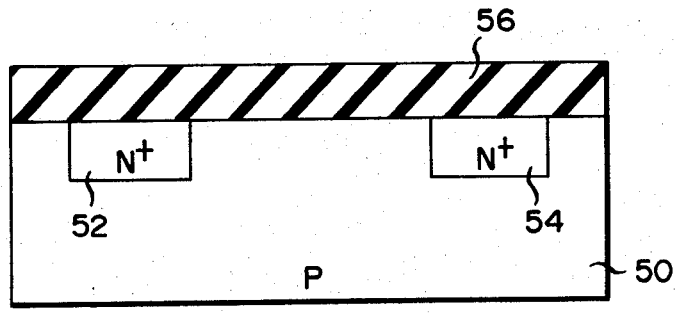
FIGS. 12A to 12F are cross sectional views of a sequence of steps of another fabricating process of an MNOS transistor according to the present invention.
Figure 12B:
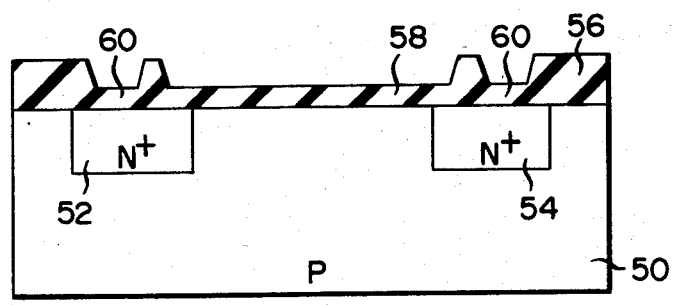

As shown in FIG. 12A, N type impurity is selectively diffused into a semiconductor substrate 50 made of silicon with P type impurity of about $1 \times 10^{15}$ cm$^{-3}$, for example, thereby to form a source region 52 of the N+ type and a drain region 54 of the same conductivity type, both regions being disposed separately. A silicon oxide film 56 with an about 1 μm thickness is formed on the surface of the substrate. Then, the silicon oxide film is selectively etched away at the gate portion and the contact portion of the MNOS transistor to expose the semiconductor substrate surface at the corresponding portions. As shown in FIG. 12B the semiconductor substrate surfaces exposed are thermally oxidized to form a thick silicon oxide film 58 with an about 1000 Å thickness serving as a gate oxide film for the source/drain protecting portion and a contact portion of a silicon oxide film 60.

Figure 12C:
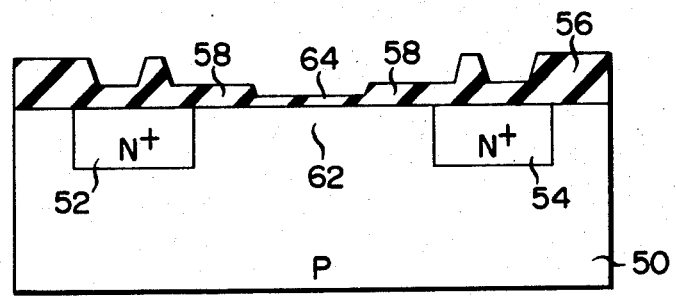

Then, the thick silicon oxide film on the center portion of the substrate region 62 separated from the source region 52 of the MNOS transistor and the drain region 54 by several μm, is removed. In the next step, the exposed semiconductor substrate surfaces are thermally oxidized to form an extremely thin silicon oxide film 64 with a 15 to 30 Å thickness, as shown in FIG. 12C.

Figure 12D:
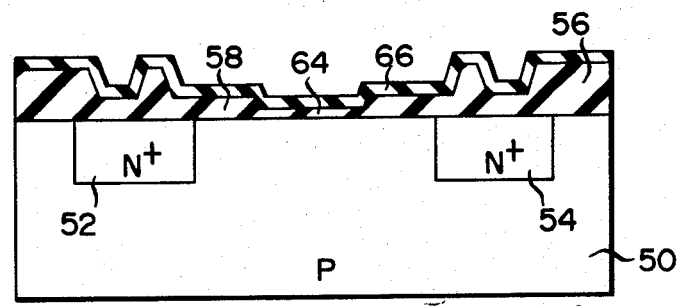

Then, a gate insulating film 66 with a memory function which is made of silicon nitride, for example, and has a thickness of 400 to 600 Å is formed over the entire surface of the semiproduct, as shown in FIG. 12D. In this step, the heat treatment is executed for improving the storage retention characteristic and a surface mobility.

Figure 12E:
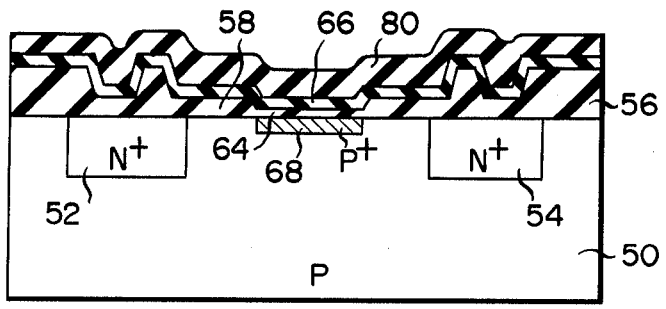

After this, a buffer layer 80 made of SiO$_2$, for example, with a proper ion stopping power at the time of the ion implantation is formed, as shown in FIG. 12E. A thickness of the buffer layer 80 may properly be designed depending on the ion implanting energy. The thickness of 1300 to 1400 Å is preferable for the P type ion implantation that the acceleration voltage is about 60 KV and the dosage is about $1 \times 10^{13}$ cm$^{-2}$. Then, under this ion implantation condition, the P type impurity of boron is implanted into the center portion of the substrate region where a channel is formed, through the buffer layer 80 with a 1300 to 1400 Å thickness, a gate insulating film 66 made of silicon nitride and with a 400 to 600 Å thickness, and an extremely thin silicon oxide film 64 with a 15 to 30 Å thickness. The thick silicon oxide film 58, the gate insulating film 66 and the buffer layer 80 serve as a mask against source/drain protecting portion. Therefore, no impurity ions are implanted into the source/drain protecting portion. The ions are implanted into only the center portion of the substrate region on which the extremely thin silicon oxide film 64 and the gate insulating film 66 are superposed to form a P+ type impurity layer 68. Even with the ion implantation at the above-mentioned high acceleration voltage, the impurity profile as indicated by the curve $\eta$ in FIG. 6 is formed in the impurity layer 68. The impurity profile is such that a peak of the impurity concentration is in the region at the depth of 500 Å or less from the surface of the semiconductor substrate 50 and the region at the depth of 500 Å or more has $10^{18}$ cm$^{-3}$ or less in the impurity concentration. After the ion implantation, a few heat treatment is performed, so that the P type impurity injected hardly diffuses laterally from the memory portion to the substrate region of the source/drain protecting portion.

Figure 12F:
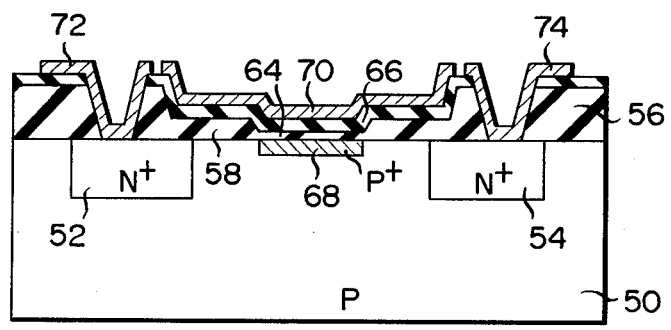

As shown in FIG. 12F, after the removal of the buffer layer 80 used in the step of the ion implantation, a contact for leading out the electrode is formed. After aluminum, for example, is deposited, the etching process is carried out, thereby to form the gate electrode 70, the source electrode 72 and the drain electrode 74 and finally to complete an MNOS transistor.

Of course, the MNOS transisor thus constructed has a characteristic similar to that in the first embodiment.

The condition for forming the P+ type impurity layer 68 is not limited to the above-mentioned embodiment. For example, the thickness of the buffer layer and the ion acceleration voltage may properly be selected so that a mean projective range of ions is in the vicinity of the surface of the semiconductor substrate.

While in the above-mentioned embodiment, the n-channel type memory device is fabricated, the present invention is applicable for the fabrication of the device of the p-channel type. In this case, the threshold window $\Delta V_{TH}$ is translated in the negative direction. The nonvolatile semiconductor memory device according to the present invention is applicable not only for the memory device of the MNOS structure but for the memory device such as the MAOS (metal alumina oxide semiconductor) structure which also has a gate insulating film with a memory function.

What we claim is:

1. A nonvolatile semiconductor memory device comprising:

a semiconductor region of a first conductivity type;

an impurity diffusion region of a second conductivity type formed in said semiconductor region;

an oxide film formed on said semiconductor region;

a gate insulating film with a memory function formed on said oxide film;

a gate electrode formed on said gate insulating film; and an impurity layer of the first conductivity type formed in the vicinity of the surface of said semiconductor region under said oxide film, said impurity layer having an impurity profile in which the peak of impurity concentration is in the region which is a distance of 500 Å or less from the surface of said semiconductor region, thereby inhibiting electrons from being injected into said gate insulating film when a write voltage is applied to said inpurity diffusion region and said gate electrode.

2. A nonvolatile semiconductor memory device according to claim 1, wherein the impurity concentration at the depth of 500 Å or more in said impurity layer is $1 \times 10^{18}$ cm$^{-3}$ or less.

3. A nonvolatile semiconductor memory device according to claim 2, wherein said oxide film includes a thick oxide film in contact with said impurity diffusion region and a thin oxide film continuous to said thick oxide film, and said impurity layer is formed under said thin oxide film.

4. A nonvolatile semiconductor memory device according to any one of claims 1 to 3, wherein said impurity diffusion region includes a source region and a drain region, and wherein said impurity layer forms a channel in the semiconductor region.

5. A nonvolatile semiconductor memory device according to any one of claims 1-3, wherein said gate insulating film is a silicon nitride film.

* * * * *